(12) United States Patent
Chiou et al.

(10) Patent No.: US 10,217,545 B2
(45) Date of Patent: Feb. 26, 2019

(54) CABLE STRUCTURE

(71) Applicant: Wistron Corp., New Taipei (TW)

(72) Inventors: Sheng-Lun Chiou, New Taipei (TW);
Yin-Yu Chen, New Taipei (TW)

(73) Assignee: WISTRON CORP., New Taipei (TW)

(*) Notice: Subject to any disclaimer, the term of this patent is extended or adjusted under 35 U.S.C. 154(b) by 18 days.

(21) Appl. No.: 14/800,114

(22) Filed: Jul. 15, 2015

(65) Prior Publication Data
US 2016/0247604 A1    Aug. 25, 2016

(30) Foreign Application Priority Data
Feb. 25, 2015    (TW) .............. 104106108 A (51) Int. Cl.
| | |
|---|---|
| *H01B 7/08* | (2006.01) |
| *H05K 1/02* | (2006.01) |
| *H01B 7/04* | (2006.01) |
| *H01P 1/202* | (2006.01) |
| *H01P 1/213* | (2006.01) |
| *H01P 1/205* | (2006.01) |

(52) U.S. Cl.
CPC .......... *H01B 7/0838* (2013.01); *H01B 7/083* (2013.01); *H01B 7/0823* (2013.01);
(Continued)

(58) Field of Classification Search
CPC .. H01B 7/0838; H01B 7/0823; H01B 7/0861; H01B 7/0018; H01B 7/0876; H01B 11/00; H01B 11/06; H01B 7/08; H01B 7/04; H01B 7/17; H01B 7/02; H01B 7/06; H01B 7/14; H01B 7/18; H01B 7/046; H01B 7/221; H01B 7/226; H01B 7/083; H01B 7/0869; H01P 1/202; H01P 1/2056;
(Continued)

(56) References Cited

U.S. PATENT DOCUMENTS 4,418,239 A * 11/1983 Larson ................ H01B 7/08
                                                                            174/117 FF
4,926,007 A *  5/1990 Aufderheide ....... H01B 7/0838
                                                                                        156/47
(Continued)

FOREIGN PATENT DOCUMENTS

| CN | 1425199 A | 6/2003 |
|---|---|---|
| CN | 1963958 A | 5/2007 |

(Continued)

*Primary Examiner* — Steven T Sawyer
*Assistant Examiner* — Paresh H Paghadal
(74) *Attorney, Agent, or Firm* — Muncy, Geissler, Olds & Lowe, P.C.

(57) ABSTRACT

A cable structure includes isolation layers, a first signal wire, a second signal wire, a first ground wire, a second ground wire, a first conductor, and a second conductor. These signal and ground wires are parallel along a first direction and between the isolation layers. These signal wires are adjacent, and the ground wires are respectively at outer sides of these signal wires. The first conductor is on at least one of the isolation layers along a second direction orthogonal to the first direction and is electrically connected to the first and second ground wires. The second conductor is on an outer surface of at least one of the second isolation layers along the first direction and is electrically connected to the first conductor. The second conductor is symmetrical based on a central line between the first and second signal wires.

11 Claims, 11 Drawing Sheets

(52) U.S. Cl.
CPC ......... *H05K 1/0218* (2013.01); *H05K 1/0219* (2013.01); *H05K 1/0224* (2013.01); *H05K 1/0227* (2013.01); *H01B 7/04* (2013.01); *H01B 7/08* (2013.01); *H01B 7/0861* (2013.01); *H01P 1/202* (2013.01); *H01P 1/205* (2013.01); *H01P 1/2135* (2013.01)

(58) Field of Classification Search
CPC ...... H01P 1/2136; H01P 1/2053; H01P 1/205; H05K 1/0218; H05K 1/0219; H05K 1/0224; H05K 1/0227
See application file for complete search history.

(56) References Cited

U.S. PATENT DOCUMENTS

| | | | | |
|---|---|---|---|---|
| 5,556,300 A | * | 9/1996 | Parker | H01R 12/596 439/497 |
| 6,294,966 B1 | | 9/2001 | Huang et al. | |
| 7,667,138 B2 | * | 2/2010 | Koga | H01B 7/0861 174/110 R |
| 8,022,308 B2 | * | 9/2011 | Hu | H05K 1/0219 174/254 |
| 8,669,483 B2 | * | 3/2014 | Shimura | H01B 7/0838 174/110 R |
| 2008/0029299 A1 | * | 2/2008 | Hakamada | H01B 7/0861 174/351 |
| 2009/0035600 A1 | * | 2/2009 | Chiang | H01B 7/0861 428/623 |
| 2012/0020416 A1 | * | 1/2012 | Shimura | H01B 7/0838 375/257 |
| 2014/0002935 A1 | | 1/2014 | Chen et al. | |

FOREIGN PATENT DOCUMENTS

| | | |
|---|---|---|
| CN | 102369581 A | 3/2012 |
| CN | 103515349 A | 1/2014 |
| TW | M441913 U1 | 11/2012 |
| TW | M473596 | 3/2014 |

\* cited by examiner

CABLE STRUCTURE

CROSS-REFERENCE TO RELATED APPLICATIONS

This non-provisional application claims priority under 35 U.S.C. § 119(a) on Patent Application No(s). 104106108 filed in Taiwan, R.O.C. on Feb. 25, 2015, the entire contents of which are hereby incorporated by reference.

TECHNICAL FIELD

The disclosure relates to a cable structure, more particularly to a cable structure capable of suppressing electromagnetic interference (EMI).

BACKGROUND

Flexible flat cables (FFC) are electrical cables produced by laminating PET isolation material and flat tinned copper wires together by automated production lines and are soft and easy to bend, be connected, and be disconnected. Such a flexible flat cable is a medium for electricity or signals and is widely applied to many electronic devices.

However, flexible flat cables generally have no sheltering layer. When a first electronic device is electrically connected to a second electronic device though a flexible flat cable for signal transmission, electromagnetic interference caused by other ambient electronic devices may easily occur on this flexible flat cable and interfere the signal transmission between the first and second electronic devices.

SUMMARY

According to one or more embodiments, the disclosure provides a cable structure for suppressing electromagnetic interference. In one embodiment, the cable structure includes a first insulation layer, a second insulation layer, a plurality of conductive wires, a first conductor, and a second conductor. The second insulation layer is on the first insulation layer. The conductive wires are parallel to each other and to a length direction and are between the first insulation layer and the second insulation layer. The conductive wires include a first signal conductive wire, a second signal conductive wire, a first ground conductive wire, and a second ground conductive wire. The first signal conductive wire and the second signal conductive wire are adjacent to each other, and the first ground conductive wire and the second ground conductive wire are respectively at one side of one of the first and second signal conductive wires and one side of the other one of the first and second signal conductive wires. The first conductor is in a width direction and on at least one of the first and second insulation layers and is electrically connected to the first and second ground conductive wires. The second conductor is in the length direction and on an outer surface of at least one of the first and second insulation layers and is electrically connected to the first conductor. The second conductor is sufficiently symmetrical based on a virtual central line between the first and second signal conductive wires. The length direction is sufficiently vertical to the width direction.

According to one or more embodiments, the disclosure provides a cable structure for suppressing electromagnetic interference. In one embodiment, the cable structure includes a first insulation layer, a second insulation layer, a plurality of conductive wires, a first conductor, and a second conductor. The second insulation layer is on the first insulation layer. The conductive wires are parallel to each other along a length direction and between the first insulation layer and the second insulation layer. The conductive wires include a first signal conductive wire, a second signal conductive wire, a first ground conductive wire, and a second ground conductive wire. The first signal conductive wire is adjacent to the second signal conductive wire, and the first ground conductive wire and the second ground conductive wire are respectively at an outer side of one of the first and second signal conductive wires and an outer side of the other one of the first and second signal conductive wires. The first conductor is in a width direction and on at least one of the first and second insulation layers and is electrically connected to the first ground conductive wire and the second ground conductive wire. The second conductor is in the length direction and on an outer surface of at least one of the first and second insulation layers and is electrically connected to the first conductor. The first signal conductive wire and the second signal conductive wire are sufficiently symmetrical to each other based on the second conductor. The length direction is sufficiently vertical to the width direction.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Following embodiments of a cable structure in the disclosure includes, for example but not limited to, four conductive wires for the illustration of the arrangement of components in the cable structure. In practice, the number of conductive wires in the cable structure can be less or more than four.

Figure 1:
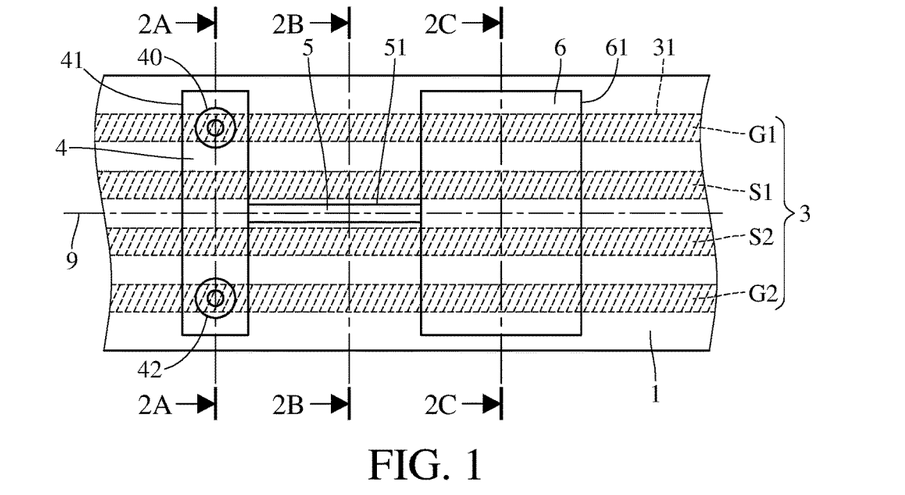
FIG. 1 is a schematic 3D view of the first embodiment of a cable structure.
Figure 2A:
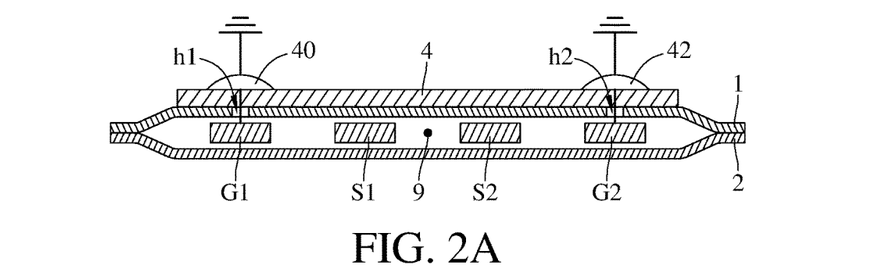
FIG. 2A is a schematic cross-sectional view of the cable structure in FIG. 1 along a cross-sectional line 2A-2A.
Figure 2B:
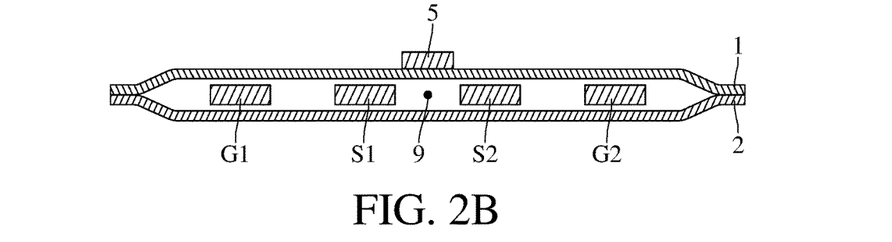
FIG. 2B is a schematic cross-sectional view of the cable structure in FIG. 1 along a cross-sectional line 2B-2B.
Figure 2C:
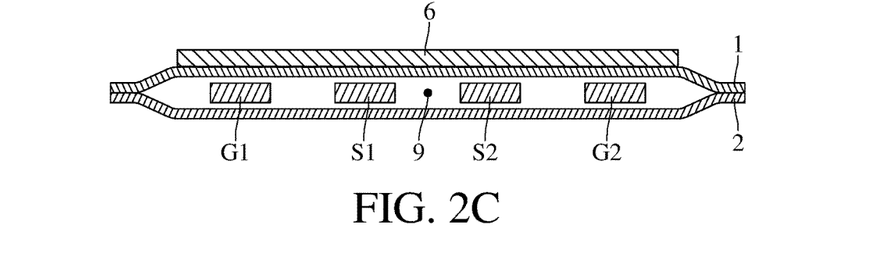
FIG. 2C is a schematic cross-sectional view of the cable structure in FIG. 1 along a cross-sectional line 2C-2C.

Please refer to FIGS. 1, 2A, 2B and 2C. FIG. 1 is a schematic 3D view of the first embodiment of a cable structure, FIG. 2A is a schematic cross-sectional view of the cable structure in FIG. 1 along a cross-sectional line 2A-2A, FIG. 2B is a schematic cross-sectional view of the cable structure in FIG. 1 along a cross-sectional line 2B-2B, and FIG. 2C is a schematic cross-sectional view of the cable structure in FIG. 1 along a cross-sectional line 2C-2C. A cable structure includes a first insulation layer 1, a second insulation layer 2, a plurality of conductive wires 3, a first conductor 4, a second conductor 5, and a third conductor 6. The first insulation layer 1 is on the second insulation layer 2. The conductive wires are arranged in parallel and located are between the first insulation layer 1 and the second insulation layer 2. Each of the conductive wires 3 has a first long side. 31. The conductive wires 3 includes, for example but not limited to, a first signal conductive wire S1, a second signal conductive wire S2, a first ground conductive wire G1, and a second ground conductive wire G2. The first signal conductive wire S1 and the second signal conductive wire S2 are adjacent to each other. The first ground conductive wire G1 and the second ground conductive wire G2 are outer sides of the first signal conductive wire S1 and the second signal conductive wire S2, respectively.

For example, the first insulation layer 1 and the second insulation layer 2 are, but not limited to, a soft coating or paper membrane. The conductive wires 3 are metallic conductive wires, for example but not limited to, flat and flexible copper wires or tinned copper wires. The conductive wires 3 are between the first insulation layer 1 and the second insulation layer 2, and each of the conductive wires 3 has a pitch with another one of the conductive wires 3. The first insulation layer 1 and the second insulation layer 2 bind together under a certain temperature to form a flexible flat cable (FFC). In other words, the flexible flat cable includes the conductive wires 3, the first insulation layer 1, and the second insulation layer 2, the conductive wires 3 are parallel to each other along a length direction, and the first insulation layer 1 and the second insulation layer 2 wrap the conductive wires 3 up.

In an embodiment, the pitches between the conductive wires 3 are the same, thereby preventing the occurrence of interference between the conductive wires 3. The pitch between the conductive wires 3 is selective. For example, the pitch is, but not limited to, 0.3 mm, 0.5 mm, 0.8 mm, 1.0 mm, 1.25 mm, 1.27 mm, 2.0 mm, or 2.54 mm.

To clarify the location relationship among the first conductor 4, the second conductor 5, the third conductor 6 and the conductive wires 3, a virtual central line 9 is defined between the first signal conductive wire S1 and the second signal conductive wire S2. The distance between the virtual central line 9 and the first signal conductive wire S1 is equal to the distance between the virtual central line 9 and the second signal conductive wire S2, and the distance between the virtual central line 9 and the first ground conductive wire G1 is equal to the distance between the virtual central line 9 and the second ground conductive wire G2. In an embodiment, the virtual central line 9 between the first signal conductive wire S1 and the second signal conductive wire S2 is considered as a virtual central line of the second conductor 5.

As shown in FIG. 1 and FIG. 2A, the first conductor 4 is on the first insulation layer 1 and is electrically connected to the first ground conductive wire G1 and the second ground conductive wire G2. In an embodiment, the first conductor 4 has a second long side 41 which is perpendicular to the first long side 31. Specifically, the first conductor 4 is on an outer surface of the first insulation layer 1, and the first conductor 4 is electrically connected to the first ground conductive wire G1 and the second ground conductive wire G2 respectively through a first through hole h1 and a second through hole h2 of the first insulation layer 1. The first conductor 4 is electrically connected to the first ground conductive wire G1 through a weld point 40 and to the second ground conductive wire G2 through a weld point 42. In this or some embodiments, an orthogonal projection of the first conductor 4 is in a space formed by the first ground conductive wire G1, the first signal conductive wire S1, the second signal conductive wire S2, and the second ground conductive wire G2.

In this embodiment, the first conductor 4 is symmetrical based on the virtual central line 9 between the first signal conductive wire S1 and the second signal conductive wire S2, that is, the first conductor 4 symmetrically corresponds to the first signal conductive wire S1 and the second signal conductive wire S2. In another embodiment, even if the first conductor 4 is asymmetrical based on the virtual central line 9 between the first signal conductive wire S1 and the second signal conductive wire S2, the cable structure is still capable of suppressing the electromagnetic interference known as the radio frequency interference (RFI).

As shown in FIG. 1 and FIG. 2B, the second conductor 5 is on an outer surface of the first insulation layer 1 and is electrically connected to the first conductor 4. The second conductor 5 has a third long side 51 which is parallel to the first long side 3. The second conductor 5 is sufficiently symmetrical based on the virtual central line 9 between the first signal conductive wire S1 and the second signal conductive wire S2, that is, the second conductor 5 uniformly and symmetrically corresponds to the first signal conductive wire S1 and the second signal conductive wire S2 or the location of the first signal conductive wire S1 and the location of the second signal conductive wire S2 are sufficiently symmetrical based on the virtual central line 9. In this embodiment, the orthogonal projection of the second conductor 5 is between the first signal conductive wire S1 and the second signal conductive wire S2. Specifically, the orthogonal projection of the second conductor 5 is in the area between the first signal conductive wire S1 and the second signal conductive wire S2. When the first conductor 4 is on the outer surface of the first insulation layer 1 or of the second insulation layer 2, the second conductor 5 and the first conductor 4 are on the outer surface of the same insulation layer.

As shown in FIG. 1 and FIG. 2C, the third conductor 6 is on the outer surface of the first insulation layer 1 and is electrically connected to the second conductor 5. The third conductor 6 has a fourth long side 61 which is perpendicular to the first long side 31. The third conductor 6 is sufficiently symmetrical based on the virtual central line 9. That is, the third conductor 6 uniformly and symmetrically corresponds to the first signal conductive wire S1 and the second signal conductive wire S2. In this embodiment, the orthogonal projection of the third conductor 6 is in an area formed by the first ground conductive wire G1, the first signal conductive wire S1, the second signal conductive wire S2, and the second ground conductive wire G2.

For example, the first conductor 4, the second conductor 5, and the third conductor 6 are, but not limited to, metal foils, such as aluminum foils, copper foils, sliver foils, conductive fabrics or sliver-copper shielding nets. In the cable structure in FIG. 1, the number of signal conductive wires and the number of ground conductive wires are two or more than two. For example, there are a plurality of signal conductive wires and a plurality of ground conductive wires between the first signal conductive wire S1 and the second signal conductive wire S2, and the arrangement of these conductive wires will be described later.

Figure 3:
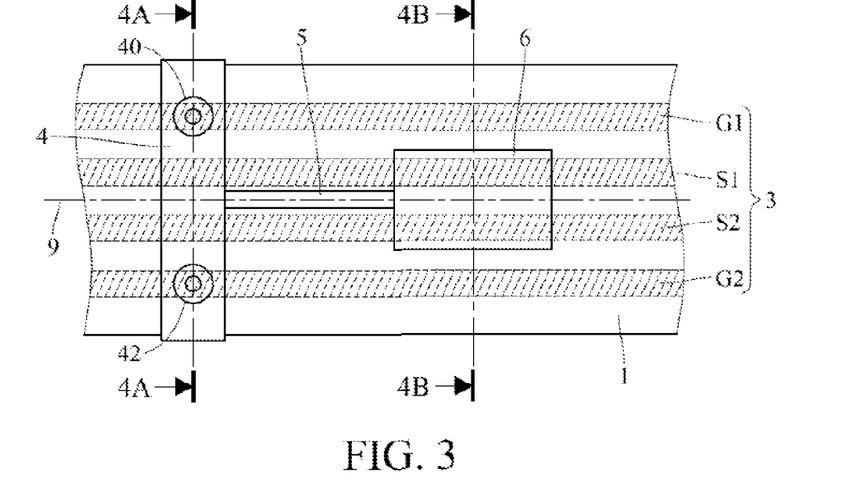
FIG. 3 is a schematic 3D view of the second embodiment of a cable structure.
Figure 4A:
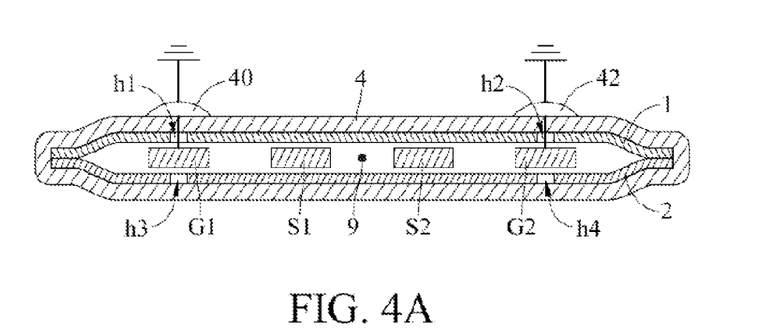
FIG. 4A is a schematic cross-sectional view of the cable structure in FIG. 3 along a cross-sectional line 4A-4A.
Figure 4B:
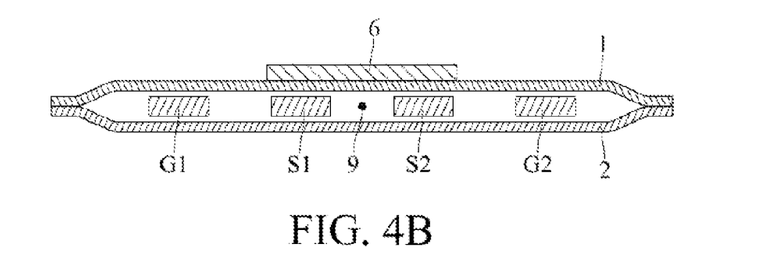
FIG. 4B is a schematic cross-sectional view of the cable structure in FIG. 3 along a cross-sectional line 4B-4B.

Please refer to FIG. 3 which is a schematic 3D view of the second embodiment of a cable structure, FIG. 4A which is a schematic cross-sectional view of the cable structure in FIG. 3 along a cross-sectional line 4A-4A, and FIG. 4B which is a schematic cross-sectional view of the cable structure in FIG. 3 along a cross-sectional line 4B-4B. As shown in FIG. 3, a cable structure includes a first insulation layer 1, a second insulation layer 2, a plurality of conductive wires 3, a first conductor 4, a second conductor 5, and a third conductor 6. The cable structure in FIG. 3 is similar to the cable structure in FIG. 1, but the first conductor 4 in FIG. 3 is on the first insulation layer 1 and the second insulation layer 2.

In view of FIG. 4A, the first conductor 4 covers on the outer surface of the first insulation layer 1 and the outer surface of the second insulation layer 2, and is electrically connected to the first ground conductive wire G1 through the first through hole h1 and the third through hole h3 in the first insulation layer 1 and to the second ground conductive wire G2 through the second through hole h2 and the fourth through hole h4 in the first insulation layer 1. In view of FIG. 4B, the orthogonal projection of the third conductor 6 is between the first signal conductive wire S1 and the second signal conductive wire S2.

According to the cable structures in FIG. 1 and FIG. 3, the first conductor 4 is in a width direction and is on the outer surface of either the first insulation layer 1 or the second insulation layer 2 or both. The first conductor 4 is electrically connected to the first ground conductive wire G1 and the second ground conductive wire G2. The second conductor 5 is in a length direction and on the outer surface of either the first insulation layer 1 or the second insulation layer 2 or on the outer surfaces of both the first insulation layer 1 and the second insulation layer 2 and is electrically connected to the first conductor 4. The third conductor 6 is in the width direction and on the outer surface of either the first insulation layer 1 or the second insulation layer 2 or on the outer surfaces of both the first insulation layer 1 and the second insulation layer 2 and is electrically connected to the second conductor 5. Moreover, the aspect ratio (i.e. the ratio of longer side to shorter side) of the first conductor 4, the aspect ratio of the second conductor 5, and the aspect ratio of the third conductor 6 can be designed according to actual application requirements.

Figure 5A:
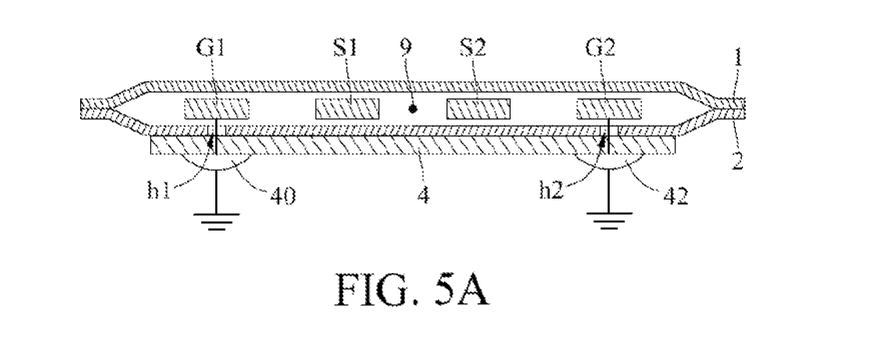
FIG. 5A is a schematic cross-sectional view of the first embodiment of the first conductor.

Please refer to FIG. 5A, which is a schematic cross-sectional view of the first embodiment of the first conductor. The first conductor 4 is on the outer surface of the second insulation layer 2 and is electrically connected to the first ground conductive wire G1 and the second ground conductive wire G2 respectively through the first through hole h1 and the second through hole h2 of the second insulation layer 2.

Figure 5B:
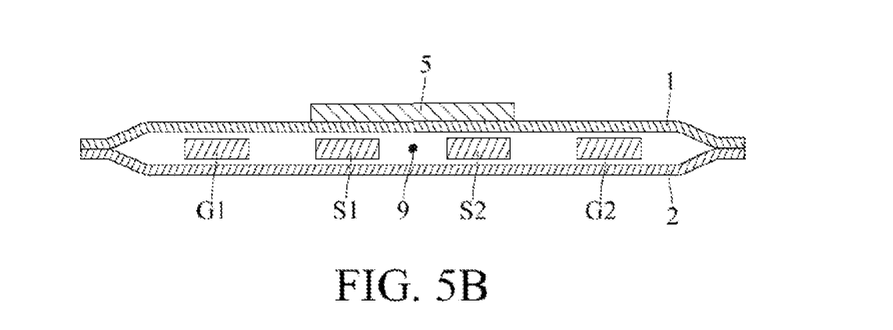
FIG. 5B is a schematic cross-sectional view of the first embodiment of the second conductor.

Please refer to FIG. 5B, which is a schematic cross-sectional view of the first embodiment of the second conductor. The second conductor 5 is on the outer surface of the first insulation layer 1 and the orthogonal projection of the second conductor 5 is between the first signal conductive wire S1 and the second signal conductive wire S2. In an embodiment, the width of the second conductor 5 is sufficiently equal to a length from the outer edge of the first signal conductive wire S1 to the outer edge of the second signal conductive wire S2, that is, the sum of the width of the first signal conductive wire S1, the gap between the first signal conductive wire S1 and the second signal conductive wire S2, and the width of the second signal conductive wire S2.

Figure 5C:
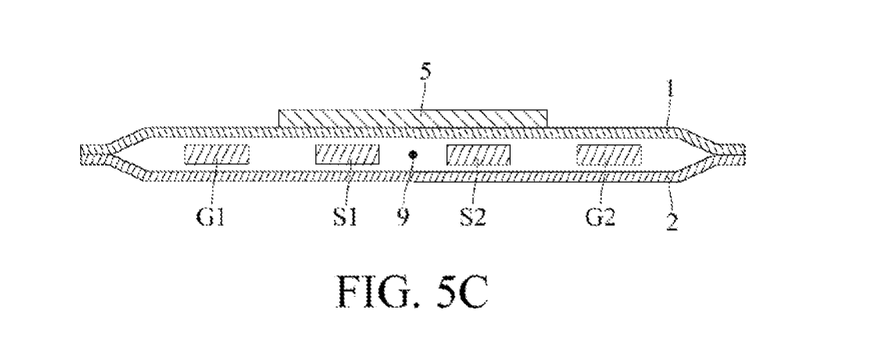
FIG. 5C is a schematic cross-sectional view of the second embodiment of the second conductor.

Please refer to FIG. 5C, which is a schematic cross-sectional view of the second embodiment of the second conductor. The second conductor 5 is on the outer surface of the first insulation layer 1, and the width of the orthogonal projection of the second conductor 5 is longer than the length from the outer edge of the first signal conductive wire S1 to the outer edge of the second signal conductive wire S2 but is shorter than the pitch between the first ground conductive wire G1 and the second ground conductive wire G2.

Figure 5D:
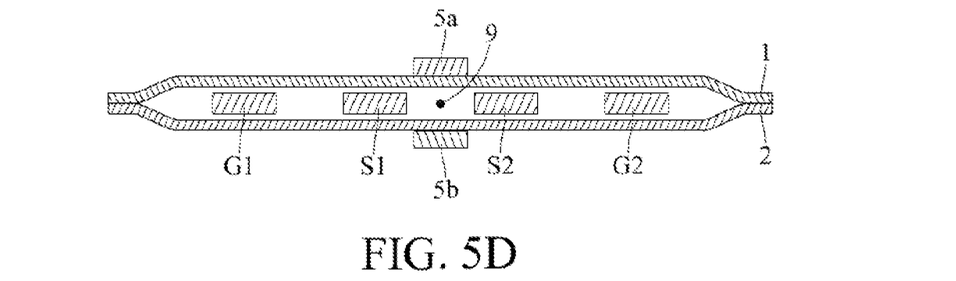
FIG. 5D is a schematic cross-sectional view of the third embodiment of the second conductor.

Please refer to FIG. 5D, which is a schematic cross-sectional view of the third embodiment of the second conductor. This cable structure includes a second conductor 5a and a second conductor 5b. The second conductor 5a is on the outer surface of the first insulation layer 1, and the second conductor 5b is on the outer surface of the second insulation layer 2. The width of the second conductor 5a is sufficiently equal to the width of the second conductor 5b. The orthogonal projection of the second conductor 5a and the orthogonal projection of the second conductor 5b are between the first signal conductive wire S1 and the second signal conductive wire S2.

Figure 5E:
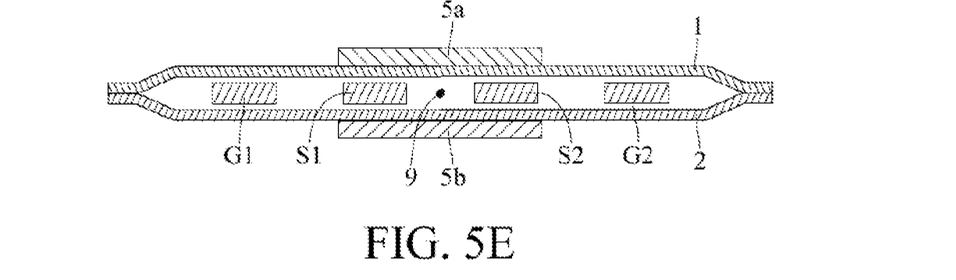
FIG. 5E is a schematic cross-sectional view of the fourth embodiment of the second conductor.

Please refer to FIG. 5E, which is a schematic cross-sectional view of the fourth embodiment of the second conductor. The cable structure includes the second conductor 5a and the second conductor 5b. The second conductor 5a is on the outer surface of the first insulation layer 1, and the second conductor 5b is on the outer surface of the second insulation layer 2. The width of the second conductor 5a is sufficiently equal to the width of the second conductor 5b, and the orthogonal projection of the second conductor 5a and the orthogonal projection of the second conductor 5b are between the first signal conductive wire S1 and the second signal conductive wire S2.

Figure 5F:
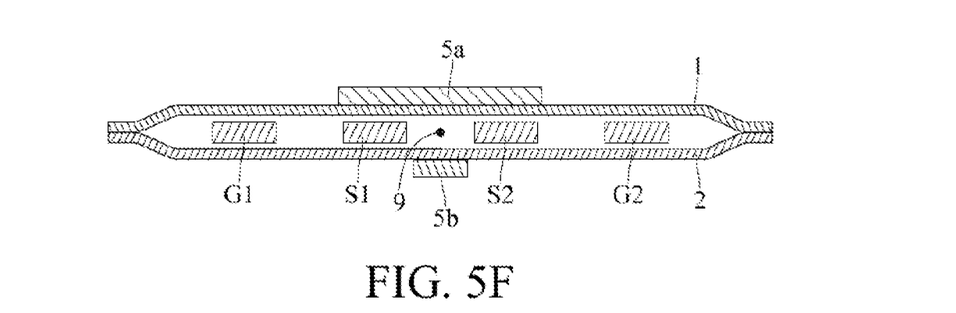
FIG. 5F is a schematic cross-sectional view of the fifth embodiment of the second conductor.

Please refer to FIG. 5F, which is a schematic cross-sectional view of the fifth embodiment of the second conductor. The cable structure includes a second conductor 5a and a second conductor 5b. The second conductor 5a is on the outer surface of the first insulation layer 1, and the second conductor 5b is on the outer surface of the second insulation layer 2. The width of the second conductor 5a is larger than the width of the second conductor 5b. The orthogonal projection of the second conductor 5a is between the first signal conductive wire S1 and the second signal conductive wire S2, and the orthogonal projection of the second conductor 5b is between the first signal conductive wire S1 and the second signal conductive wire S2.

Figure 6A:
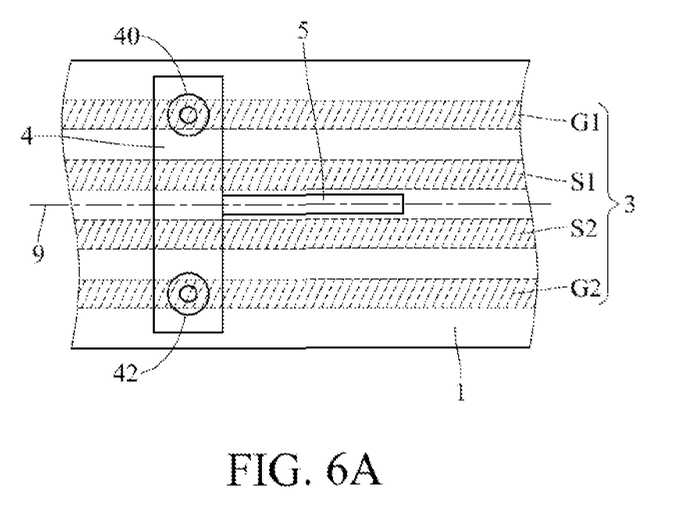
FIG. 6A is a schematic 3D view of the third embodiment of a cable structure.

Although the first conductor 4, the second conductor 5 and the third conductor 6 in both FIG. 1 and FIG. 3 are H-shaped electric-conductive structures, they may be replaced by T-shaped electric-conductive structures according to actual application requirements, e.g. filtering off noises in different frequency bands. As shown in FIG. 6A, which is a schematic 3D view of the third embodiment of a cable structure. The cable structure in FIG. 6A includes a first insulation layer 1, a second insulation layer 2, a plurality of conductive wires 3, a first conductor 4, and a second conductor 5. The cable structure in FIG. 6A is similar to the cable structure in FIG. 1 but lacks the third conductor 6. The disposition of the first conductor 4 and the second conductor 5 in this embodiment can be referred to the above description and thus, will not be repeated hereinafter.

Figure 6B:
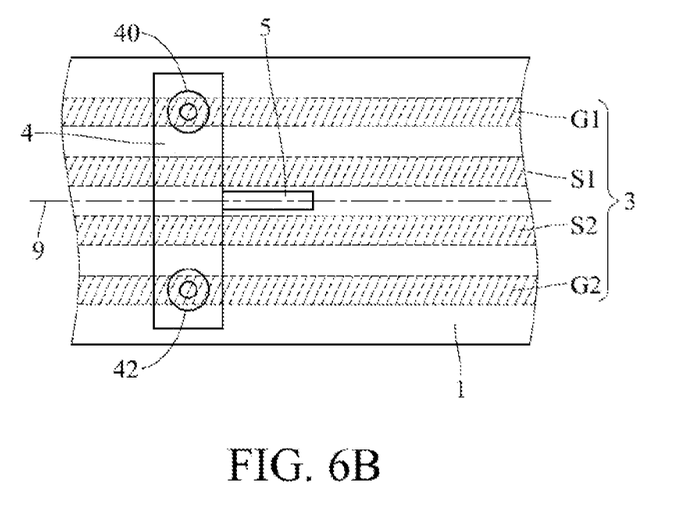
FIG. 6B is a schematic 3D view of another third embodiment of a cable structure.

In addition, the length of the second conductor 5 along the length direction can be designed according to actual application requirements. Please refer to FIG. 6B, which is a schematic 3D view of another third embodiment of a cable structure. The second conductor 5 along the length direction as shown in FIG. 6B has a length shorter than the length of the second conductor 5 along the length direction as shown in FIG. 6A.

Figure 6C:
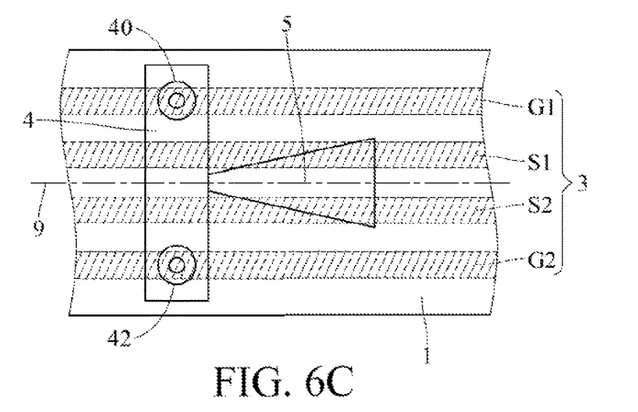
FIG. 6C is a schematic 3D view of the fourth embodiment of a cable structure.
Figure 6D:
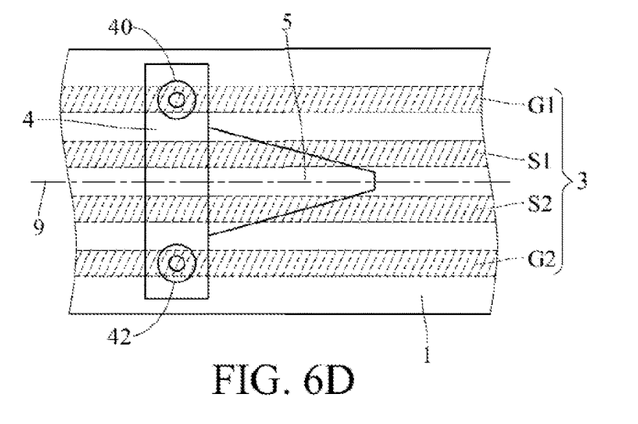
FIG. 6D is a schematic 3D view of the fifth embodiment of a cable structure.
Figure 6E:
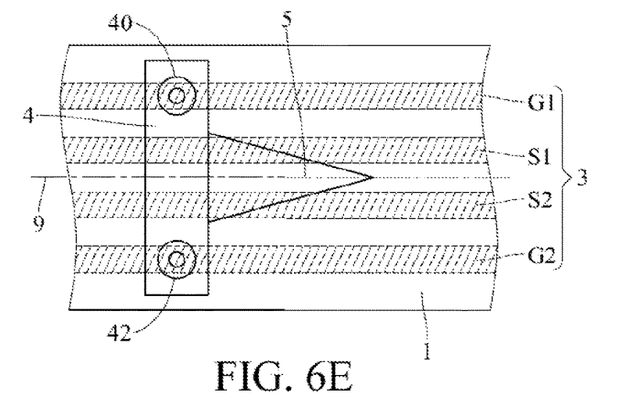
FIG. 6E is a schematic 3D view of the sixth embodiment of a cable structure.

In the foregoing one or more embodiments, the second conductor 5 is rectangular so that the width of the second conductor 5 at the side far from the first conductor 4 is sufficiently equal to the width of the second conductor 5 at the side close to the first conductor 4. In other one or more embodiments, the second conductor 5 can have another shape, that is, the width of the second conductor 5 at the side far from the first conductor 4 is different from the width of the second conductor 5 at the side close to the first conductor 4. As shown in FIG. 6C to FIG. 6E, various shapes for the second conductor 5 are provided. FIG. 6C is a schematic 3D view of the fourth embodiment of a cable structure, FIG. 6D is a schematic 3D view of the fifth embodiment of a cable structure, and FIG. 6E is a schematic 3D view of the sixth embodiment of a cable structure.

As shown in FIG. 6C, the width of the second conductor 5 at the side far from the first conductor 4 is longer than the width of the second conductor 5 at the side close to the first conductor 4, and the shape of the second conductor 5 is an isosceles trapezoid. As shown in FIG. 6D, the width of the second conductor 5 at the side far from the first conductor 4 is shorter than the width of the second conductor 5 at the side close to the first conductor 4, and the shape of the second conductor 5 is an isosceles trapezoid. As shown in FIG. 6E, the width of the second conductor 5 at the side far from the first conductor 4 is shorter than the width of the second conductor 5 at the side close to the first conductor 4, and the shape of the second conductor 5 is an isosceles triangle where the side of the second conductor 5 farthest from the first conductor 4 is a vertex.

The above embodiments of the cable structure have different common mode impedances and thus, are capable of filtering off noises in different frequency bands. In other words, a different cable structure is able to be considered as a common mode filter for a different frequency band to filter off. Therefore, the distribution of noises among the conductive wires 3 may be controlled well to reduce the cable's radiations as well as the electromagnetic interference.

Figure 7A:
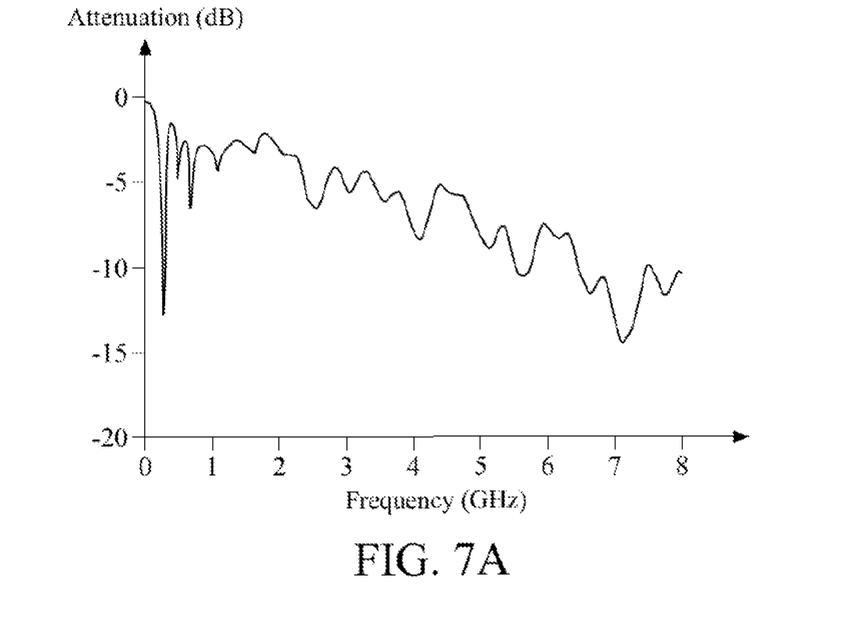
FIG. 7A is a schematic oscillogram of a common-mode signal traveling in the cable structure in FIG. 1.
Figure 7B:
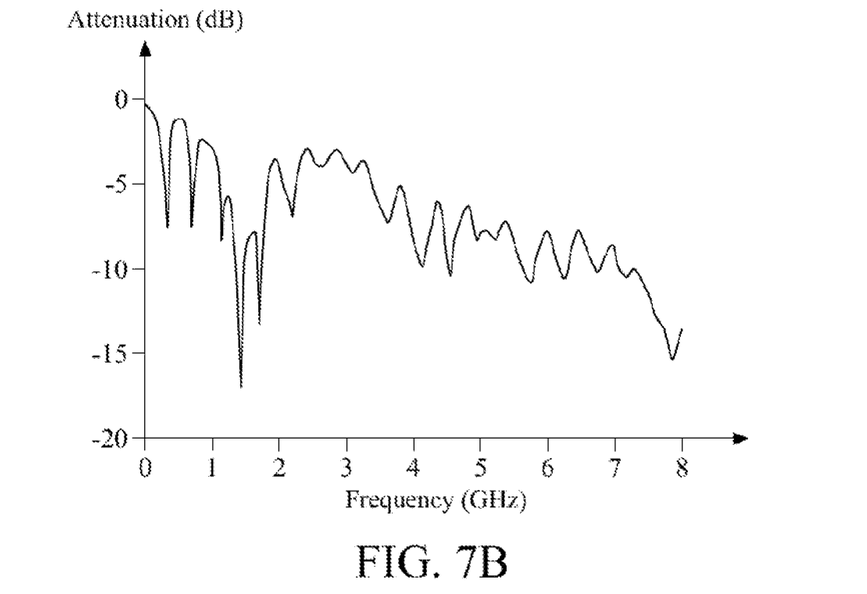
FIG. 7B is a schematic oscillogram of a common-mode signal traveling in the cable structure in FIG. 6A.
Figure 7C:
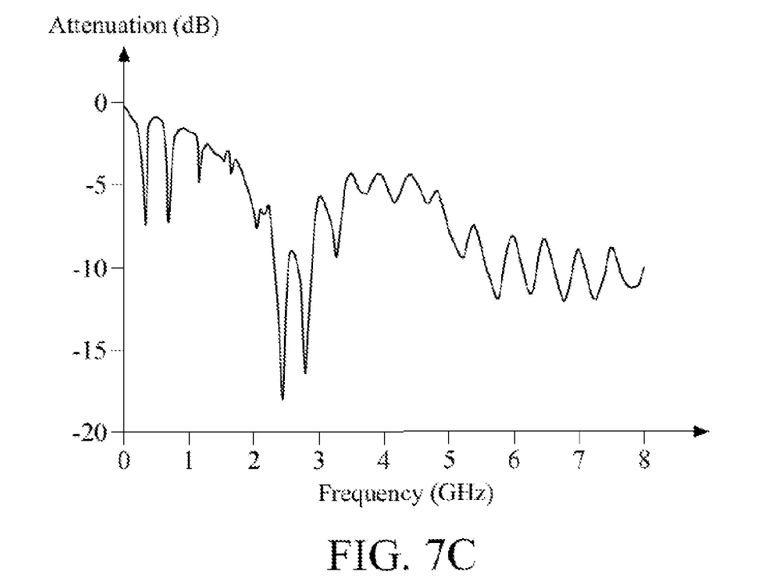
FIG. 7C is a schematic oscillogram of a common-mode signal traveling in the cable structure in FIG. 6B.
Figure 7D:
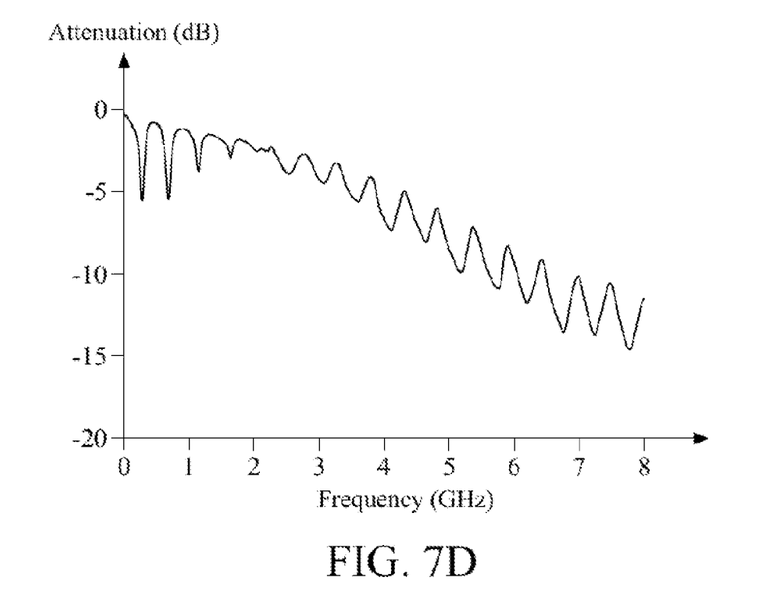
FIG. 7D is a schematic oscillogram of a common-mode signal traveling in a conventional cable structure.

Please refer to FIG. 7A to FIG. 7D for clarifying that a different cable structure can filter off noise in a different frequency band. FIG. 7A is a schematic oscillogram of a common-mode signal traveling in the cable structure in FIG. 1, FIG. 7B is a schematic oscillogram of a common-mode signal traveling in the cable structure in FIG. 6A, FIG. 7C is a schematic oscillogram of a common-mode signal traveling in the cable structure in FIG. 6B, and FIG. 7D is a schematic oscillogram of a common-mode signal traveling in a conventional cable structure.

In view of FIG. 7A, when the signals flowing in the first signal conductive wire S1 and the second signal conductive wire S2 pass through the H-shaped electric-conductive structure shown in FIG. 1, the H-shaped electric-conductive structure filters out or reflects noise signals of 0 to 1 GHz so that noise in such a band will not pass through the H-shaped electric-conductive structure. In view of FIG. 7B, when the signals flowing in the first signal conductive wire S1 and the second signal conductive wire S2 pass through the T-shaped electric-conductive structure shown in FIG. 6A, the T-shaped electric-conductive structure filters out or reflects the noise of 1 to 2 GHz so that the noise in this band cannot pass through the T-shaped electric-conductive structure. In view of FIG. 7C, when the signals flowing in the first signal conductive wire S1 and the second signal conductive wire S2 pass through the T-shaped electric-conductive structure shown in FIG. 6B, this T-shaped electric-conductive structure filters out or reflects the noises of 2 to 3 GHz so that the noises in this band cannot pass through the T-shaped electric-conductive structure. In view of FIG. 7D, since the conventional cable structure lacks the H-shaped or T-shaped electric-conductive structure, the signals flowing in the first signal conductive wire S1 and the second signal conductive wire S2 as well as noises will be transmitted.

In the foregoing one or more embodiments, the first conductor 4 is on the outer surface of either the first insulation layer 1 or the second insulation layer 2 or on the outer surfaces of both the first insulation layer 1 and the second insulation layer 2. In one or more other embodiments, the first conductor 4 is on the inner surface of either the first insulation layer 1 or the second insulation layer 2 or on the outer surfaces of both the first insulation layer 1 and the second insulation layer 2. Please refer to FIG. 8A and FIG. 9A, which are respectively a schematic 3D view of the seventh embodiment of a cable structure and a schematic cross-sectional view of the cable structure in FIG. 8A along a cross-sectional line 9A-9A. The first conductor 4 is on the inner surface of the first insulation layer 1 and is electrically connected to the first ground conductive wire G1 and the second ground conductive wire G2.

Figure 8A:
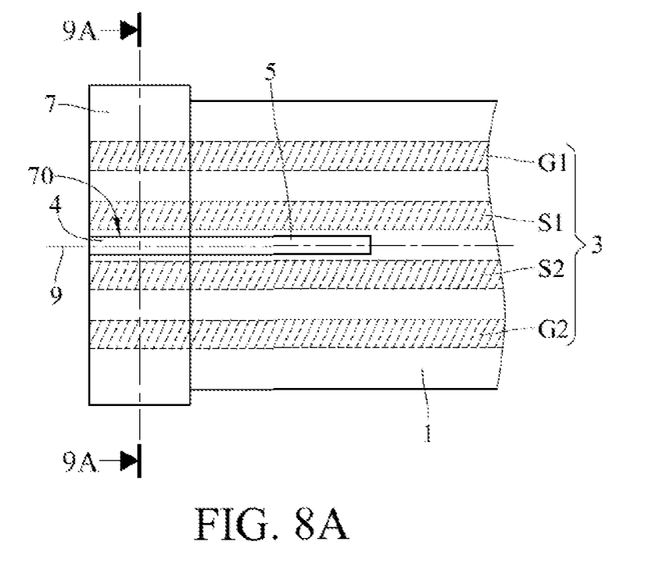
FIG. 8A is a schematic 3D view of the seventh embodiment of a cable structure.
Figure 9A:
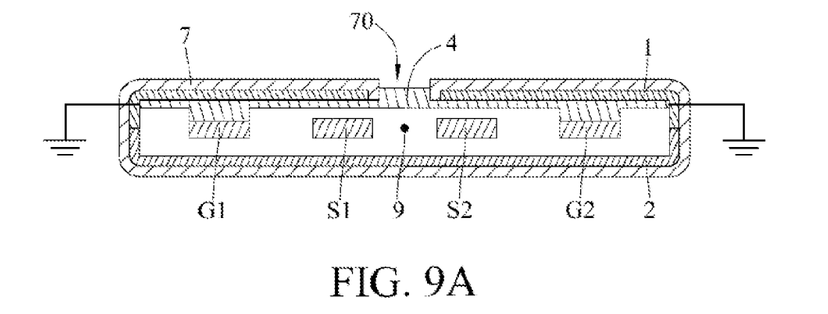
FIG. 9A is a schematic cross-sectional view of the cable structure in FIG. 8A along a cross-sectional line 9A-9A.

A connector 7 is on the outer surface of the first insulation layer 1 and the outer surface of the second insulation layer 2, and the location of the connector 7 corresponds to the location of the first conductor 4. The connector 7 is like a case on the first insulation layer 1 and has an opening 70. The opening 70 exposes a part of the first conductor 4 so that the second conductor 5 exposed from the outer surface of the first insulation layer 1 is extended and electrically connected to the first conductor 4 exposed from the opening 70. The extended direction of the opening 70 is sufficiently parallel to the length direction, i.e. to the virtual central line 9. The width of the opening 70 is sufficiently equal to the width of the second conductor 5.

Figure 8B:
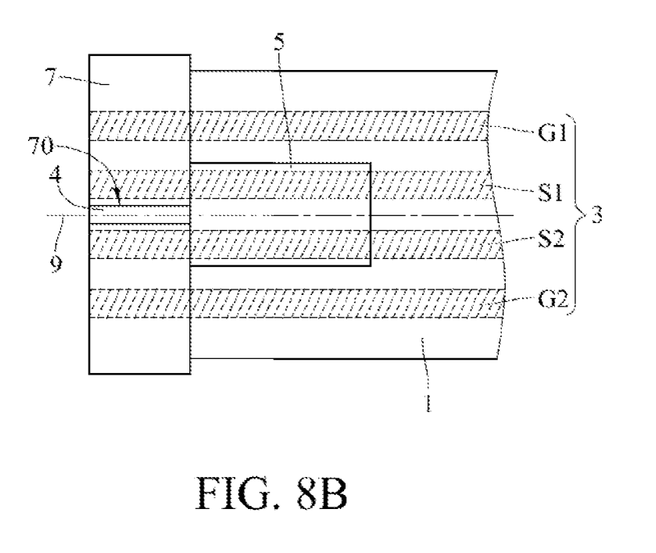
FIG. 8B is a schematic 3D view of another seventh embodiment of a cable structure.

In other embodiments, as long as the second conductor 5 can be electrically connected to the first conductor 4 exposed from the opening 70, the extended direction of the opening 70 may not be parallel to the length direction and the width of the opening 70 may be different from the width of the second conductor 5. Please refer to FIG. 8B, which is a schematic 3D view of another seventh embodiment of a cable structure. The width of the opening 70 is about equal to the pitch between the first signal conductive wire S1 and the second signal conductive wire S2, and the width of the second conductor 5 is about equal to the length from the outer edge of the first signal conductive wire S1 to the outer edge of the second signal conductive wire S2. The width of the opening 70 is different from the width of the second conductor 5.

Figure 9B:
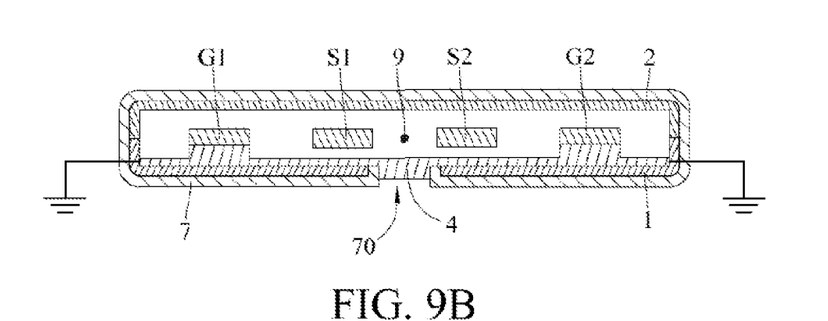
FIG. 9B is a schematic cross-sectional view of the second embodiment of the first conductor.
Figure 9C:
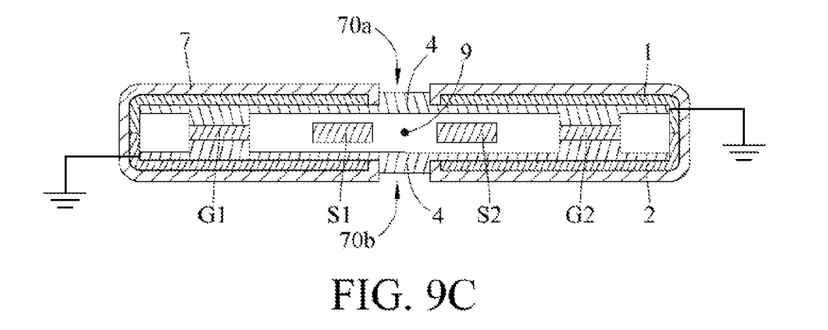
FIG. 9C is a schematic cross-sectional view of the third embodiment of the first conductor.

In this or some embodiments, the location and opening direction of the opening 70 of the connector 7 can be designed according to actual application requirements. Please refer to FIG. 9B and FIG. 9C, which are respectively a schematic 3D view of another seventh embodiment of a cable structure and a schematic cross-sectional view of the cable structure in FIG. 8A along a cross-sectional line 9A-9A. The first conductor 4 in FIG. 9B is on the inner surface of the second insulation layer 2 so that the opening 70 of the connector 7 is located on the location of the second insulation layer 2. The first conductor 4 in FIG. 9C is on the inner surface of the first insulation layer 1 such that an opening 70a of the connector 7 passes through the first insulation layer 1 in FIG. 9C. Similarly, since the inner surface of the first conductor 4 in FIG. 9C is on the second insulation layer 2, an opening 70b of the connector 7 passes through the second insulation layer 2. The first conductor 4 in FIG. 9C is capable combining with any embodiment of the second conductor 5 in FIG. 5D to FIG. 5F.

Figure 10A:
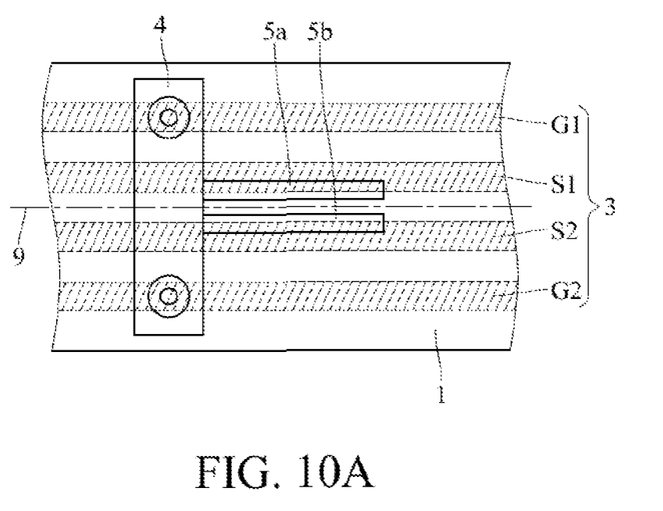
FIG. 10A is a schematic 3D view of the eighth embodiment of a cable structure.

Additionally, the number and location of the second conductor 5 in the cable structure can be designed according to actual application requirements. If the cable structure includes a plurality of second conductors 5, one end of each of these second conductors 5 is electrically connected to the first conductor 4 and these second conductors 5 are symmetrical to each other based on the virtual central line 9. Please refer to FIG. 10A, which is a schematic 3D view of the eighth embodiment of a cable structure. A cable structure includes a first insulation layer 1, a second insulation layer 2, a plurality of conductive wires 3, a first conductor 4, a second conductor 5a, and a second conductor 5b. The second conductor 5a and the second conductor 5b are electrically connected to the first conductor 4 and are sufficiently symmetrical to each other based on the virtual central line 9. The orthogonal projection of the second conductor 5a and the orthogonal projection of the second conductor 5b are between the first signal conductive wire S1 and the second signal conductive wire S2.

Figure 10B:
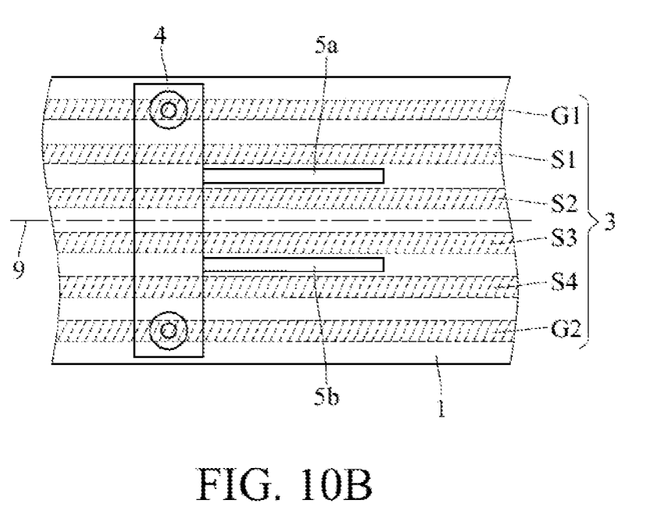
FIG. 10B is a schematic 3D view of the ninth embodiment of a cable structure.

Please refer to FIG. 10B, which is a schematic 3D view of the ninth embodiment of a cable structure. A cable structure includes a first insulation layer 1, a second insulation layer 2, a plurality of conductive wires 3, a first conductor 4, a second conductor 5a, and a second conductor 5b. The conductive wires 3 in FIG. 10B includes a first signal conductive wire S1, a second signal conductive wire S2, a third signal conductive wire S3, a fourth signal conductive wire S4, a first ground conductive wire G1, and a second ground conductive wire G2. The first signal conductive wire S1, the second signal conductive wire S2, the third signal conductive wire S3 and the fourth signal conductive wire S4 are adjacent to each other, and the first ground conductive wire G1 and the second ground conductive wire G2 are outer ones of the conductive wires 3.

The second conductor 5a and the second conductor 5b are electrically connected to the first conductor 4. The first signal conductive wire S1 and the second signal conductive wire S2 are sufficiently symmetrical to the second conductor 5a and the third signal conductive wire S3, and the fourth signal conductive wire S4 is sufficiently symmetrical to the second conductor 5b. In other words, the location of the first signal conductive wire S1 and the location of the fourth signal conductive wire S4 are sufficiently symmetrical based on the virtual central line 9 between the conductive wires 3. In other words, the location of the first signal conductive wire S1 and the location of the fourth signal conductive wire S4 are sufficiently symmetrical to each other based on the virtual central line 9 between the second conductor 5a and the second conductor 5b. Similarly, the location of the second signal conductive wire S2 and the location of the third signal conductive wire S3 are sufficiently symmetrical to each other based on the virtual central line 9. The orthogonal projection of the second conductor 5a is between the first signal conductive wire S1 and the second signal conductive wire S2, and the orthogonal projection of the second conductor 5b is between the third signal conductive wire S3 and the fourth signal conductive wire S4.

The above cable structures in FIG. 8A to FIG. 9C are suitably applied to a connector of a flexible flat cable, and the T-shaped and H-shaped electric-conductive structures in other embodiments of the cable structure are suitably applied to any section of the flexible flat cable except the connector. The arrangement of the T-shaped and/or H-shaped electric-conductive structure in the flexible flat cable can be designed according to actual application requirements. In an embodiment, the flexible flat cable can be disposed with one T-shaped or H-shaped electric-conductive structure. In another embodiment, the flexible flat cable can be disposed with the T-shaped and H-shaped electric-conductive structures alternately. For example, the flexible flat cable is disposed with the structure in FIG. 9A, the H-shaped electric-conductive structure, the H-shaped electric-conductive structure, and the structure in FIG. 9A in order, with the structure in FIG. 9A, the T-shaped electric-conductive structure, the H-shaped electric-conductive structure, and the structure in FIG. 9A in order, with the structure in FIG. 9A, the T-shaped electric-conductive structure, the H-shaped electric-conductive structure, the H-shaped electric-conductive structure, the T-shaped electric-conductive structure, and the structure in FIG. 9A in order, but the disclosure will not be limited thereto.

In addition, the number of conductive wires and the arrangement of these conductive wires in the cable structure can be designed according to actual application requirements. In the embodiments in FIG. 1 to FIG. 10A, the cable structure has four conductive wires and the arrangement of the four conductive wires is "GSSG", where "G" represents a ground conductive wire and "S" represents a signal conductive wire. In some embodiments, the cable structure has, but not limited to, 16 conductive wires and the arrangement of these conductive wires is, but not limited to, "GSSGGSSGGSSGGSSG", "GSSGSSGSSGSSGSSG", "GSSSSGSSSSGSSSSG", "GSSSSSSGGSSSSSSG" or "GSSSSSSSSSSSSSSG".

As set forth above, the disclosure provides a cable structure where the first conductor and the second conductor are on at least one surface of the conventional flexible flat cable. The first conductor is electrically connected to two ground conductive wires that are respectively at one side of one of two signal conductive wires and one side of the other one of the two signal conductive wires in the flexible flat cable. The second conductor is electrically connected to the first conductor and is sufficiently symmetrical based on a virtual central line between the two signal conductive wires, or the first signal conductive wire and the second signal conductive wire are sufficiently symmetrical to each other based on the second conductor. Therefore, the combination of the first conductor and the second conductor is considered as a T-shaped electric-conductive structure that may be disposed at any section of the flexible flat cable for filtering off noises in a certain frequency band.

The disclosure provides another cable structure where a first conductor, a second conductor, and a third conductor are on at least one surface of a conventional flexible flat cable. The first conductor is electrically connected to two ground conductive wires which are respectively at one side of one of two signal conductive wires and one side of the other one of the two signal conductive wires in the flexible flat cable. One end of the second conductor is electrically connected to the first conductor, and the other end of the second conductor is electrically connected to the third conductor. The second conductor and the third conductor are sufficiently symmetrical to each other based on a virtual central line between the two signal conductive wires. Therefore, the combination of the first, second and third conductors is considered as a H-shaped electric-conductive structure that may be disposed at any section of the flexible flat cable for filtering off noises in a certain frequency band.

The disclosure provides another cable structure where a first conductor is within the casing of a connector of a conventional flexible flat cable and a second conductor is on at least one surface of the flexible flat cable. Such a casing has at least one opening. The first conductor is electrically connected to two ground conductive wires which are respectively at one side of one of two signal conductive wires and one side of the other one of the two signal conductive wires in the flexible flat cable. The second conductor is electrically connected to a part of the first conductor that is exposed from the opening. Therefore, the combination of the first and second conductors is considered as another T-shaped electric-conductive structure which may be disposed on the connector of the flexible flat cable in order to filter off noises in a certain frequency band.

Accordingly, when including such a T-shaped electric-conductive structure or H-shaped electric-conductive structure, the cable structure in the disclosure may be able to efficiently control the distribution of noises for the conductive wires and adjust the common mode impedance of the cable structure, so as to filter off noises in various frequency bands and reduce the electromagnetic interference.

What is claimed is:

1. A cable structure for suppressing electromagnetic interference, comprising:
   a first insulation layer;
   a second insulation layer on the first insulation layer;
   a plurality of conductive wires paralleling to each other and located between the first and second insulation layers, each of the plurality of conductive wires having a first long side, and the plurality of conductive wires comprising a first signal conductive wire, a second signal conductive wire, a first ground conductive wire, and a second ground conductive wire, the first and second signal conductive wires being adjacent to each other, and the first and second ground conductive wires respectively being an outer side of one of the first and second signal conductive wires and an outer side of the other one of the first and second signal conductive wires;
   a first conductor on at least one of the first and second insulation layers and electrically connected to the first and second ground conductive wires, wherein the first conductor has a second long side which is perpendicular to the first long side;
   a second conductor on an outer surface of at least one of the first and second insulation layers, being electrically connected to the first conductor so as to be electrically connected to the first and second ground conductive wires, wherein the second conductor has a third long side which is parallel to the first long side, and the second conductor is symmetrical based on a virtual central line between the first and second signal conductive wires;
   a third conductor on an outer surface of at least one of the first insulation layer and the second insulation layer and being symmetrical based on the virtual center line, wherein the third conductor has a fourth long side which is perpendicular to the first long side, and
   wherein the first conductor, the second conductor and the third conductor are all disposed on the outer surface of at least one of the first insulation layer and the second insulation layer, the second conductor is located between the first and second ground conductive wires, and two opposite ends of the second conductor are respectively electrically and physically connected to the first conductor and the third conductor so that the first conductor, the second conductor and the third conductor form an H-shape structure directly on at least one of the first insulation layer and the second insulation layer.

2. The cable structure according to claim 1, wherein when the first conductor is on the outer surface of at least one of the first and second insulation layers, the first or second insulation layer comprises a first through hole and a second through hole, and the first conductor is electrically connected to the first and second ground conductive wires respectively through the first and second through holes.

3. The cable structure according to claim 2, wherein the first through hole overlaps the first ground conductive wire, and the second through hole overlaps the second ground conductive wire.

4. The cable structure according to claim 1, wherein an orthogonal projection of the second conductor is between the first signal conductive wire and the second signal conductive wire.

5. The cable structure according to claim 1, wherein the conductive wires have the same pitch therebetween.

6. A cable structure for suppressing electromagnetic interference, comprising:
   a first insulation layer;
   a second insulation layer on the first insulation layer;
   a plurality of conductive wires parallel to each other and located between the first and second insulation layers, each of the plurality of conductive wires having a first long side, and the plurality of conductive wires comprising a first signal conductive wire, a second signal conductive wire, a first ground conductive wire, and a second ground conductive wire, the first and second signal conductive wires being adjacent to each other, the first and second ground conductive wires respectively being an outer side of one of the first and second signal conductive wires and an outer side of the other one of the first and second signal conductive wires;

a first conductor on at least one of the first and second insulation layers and being electrically connected to the first and second ground conductive wires, wherein the first conductor has a second long side which is perpendicular to the first long side;

a second conductor on an outer surface of at least one of the first and second insulation layers and being electrically connected to the first conductor so as to be electrically connected to the first and second ground conductive wires, wherein the second conductor has a third long side which is parallel to the first long side, and the first and second signal conductive wires being symmetrical to each other based on the second conductor; and a third conductor on an outer surface of at least one of the first insulation layer and the second insulation layer and being symmetrical based on the virtual center line, wherein the third conductor has a fourth long side which is perpendicular to the first long side, wherein the first conductor, the second conductor and the third conductor are all disposed on the outer surface of at least one of the first insulation layer and the second insulation layer, the second conductor is located between the first and second ground conductive wires, and two opposite ends of the second conductor are respectively electrically and physically connected to the first conductor and the third conductor so that the first conductor, the second conductor and the third conductor form an H-shape structure directly on at least one of the first insulation layer and the second insulation layer.

7. The cable structure according to claim 6, wherein locations of the first and second signal conductive wires are symmetrical based on a virtual central line of the second conductor.

8. The cable structure according to claim 6, wherein when the first conductor is on an outer surface of at least one of the first and second insulation layers, the first conductor is electrically connected to the first ground conductive wire and the second ground conductive wire respectively through a first through hole and a second through hole of the first or second insulation layer.

9. The cable structure according to claim 8, wherein the first through hole overlaps the first ground conductive wire, and the second through hole overlaps the second ground conductive wire.

10. The cable structure according to claim 6, wherein an orthogonal projection of the second conductor is between the first signal conductive wire and the second signal conductive wire.

11. The cable structure according to claim 6, wherein the conductive wires have the same pitch therebetween.

\* \* \* \* \*